(12) United States Patent
Kim et al.

(10) Patent No.: US 9,525,410 B2
(45) Date of Patent: Dec. 20, 2016

(54) POWER MANAGEMENT CHIPS AND POWER MANAGEMENT DEVICES INCLUDING THE SAME

(75) Inventors: Ho-jung Kim, Suwon-si (KR); Jai-kwang Shin, Anyang-si (KR); U-in Chung, Seoul (KR); Hyun-sik Choi, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 806 days.

(21) Appl. No.: 13/588,488

(22) Filed: Aug. 17, 2012

(65) Prior Publication Data

US 2013/0241520 A1   Sep. 19, 2013

(30) Foreign Application Priority Data

Mar. 14, 2012 (KR) .................. 10-2012-0026200

(51) Int. Cl.
| | |
|---|---|
| *H03K 17/687* | (2006.01) |
| *H02M 1/08* | (2006.01) |
| *H02M 3/337* | (2006.01) |
| *H01L 29/778* | (2006.01) |
| *H01L 29/16* | (2006.01) |
| *H01L 29/20* | (2006.01) |
| *H01L 21/82* | (2006.01) |
| *H01L 21/8252* | (2006.01) |

(52) U.S. Cl.
CPC .......... *H03K 17/687* (2013.01); *H01L 21/8213* (2013.01); *H01L 21/8252* (2013.01); *H01L 29/1608* (2013.01); *H01L 29/2003* (2013.01); *H01L 29/7787* (2013.01); *H02M 1/08* (2013.01); *H02M 3/337* (2013.01); *H03K 2217/0036* (2013.01); *H03K 2217/0063* (2013.01); *H03K 2217/0072* (2013.01); *H03K 2217/0081* (2013.01)

(58) Field of Classification Search
CPC .......... H01L 23/50; H01L 2924/10272; H01L 2924/1033; G05F 3/02; H02M 3/00; H03K 19/0956; H03K 17/687
USPC ... 326/82, 116, 117, 118; 307/412; 327/112; 365/154; 257/76; 323/311; 438/275
See application file for complete search history.

(56) References Cited

U.S. PATENT DOCUMENTS

| | | | |
|---|---|---|---|
| 4,661,831 A * | 4/1987 | Schmitt-Landsiedel et al. ........................ | 365/154 |
| 5,451,890 A * | 9/1995 | Martin et al. .................. | 326/118 |
| 6,307,409 B1 * | 10/2001 | Wrathall ....................... | 327/112 |

(Continued)

FOREIGN PATENT DOCUMENTS

KR   100797014 B1   1/2008

OTHER PUBLICATIONS

Zhenxian Liang; van Wyk, J.D.; Lee, F.C.; Boroyevich, D.; Scott, E.P.; Zhou Chen; Yingfeng Pang, "Integrated packaging of a 1 kW switching module using a novel planar integration technology," in IEEE Transactions on Power Electronics, vol. 19, No. 1, pp. 242-250, Jan. 2004.*

*Primary Examiner* — Gary L Laxton
*Assistant Examiner* — Jye-June Lee
(74) *Attorney, Agent, or Firm* — Harness, Dickey & Pierce, P.L.C.

(57) ABSTRACT

A power management chip and a power management device including the power management chip. The power management chip includes at least one power switch and a driver unit for generating a driving signal for driving the at least one power switch, the driver unit including one or more circuit units formed on a same substrate as the at least one power switch.

13 Claims, 8 Drawing Sheets

(56) References Cited

U.S. PATENT DOCUMENTS

| | | | |
|---|---|---|---|
| 6,518,791 B2* | 2/2003 | Kojima et al. | 326/82 |
| 7,863,877 B2 | 1/2011 | Briere | |
| 2007/0221994 A1 | 9/2007 | Ishikawa et al. | |
| 2009/0180304 A1 | 7/2009 | Bahramian et al. | |
| 2010/0109015 A1* | 5/2010 | Ueno | 257/76 |
| 2011/0157949 A1 | 6/2011 | Bahramian | |

* cited by examiner

POWER MANAGEMENT CHIPS AND POWER MANAGEMENT DEVICES INCLUDING THE SAME

CROSS-REFERENCE TO RELATED APPLICATIONS

This application claims priority to Korean Patent Application No. 10-2012-0026200, filed on Mar. 14, 2012, in the Korean Intellectual Property Office, the entire disclosure of which is incorporated herein by reference.

BACKGROUND

1. Field

The present disclosure relates to power management chips using power semiconductors and power management devices including the power management chips.

2. Description of the Related Art

Power semiconductors that receive a main power and convert the received power into particular voltages or distribute the power to a plurality of devices are being adopted in electronic devices. The power semiconductor may be manufactured using a silicon-based semiconductor, or may be realized as a gallium nitride (GaN) transistor or a silicon carbide (SiC) transistor based on a compound semiconductor such as GaN or SiC.

Power semiconductors may be used as a unit for switching power voltages in a power management chip. However, when driving the power management chip, noise may occur and power efficiency may be affected due to parasitic RLC elements. In addition, the power management chip is driven by a high voltage transistor and, thus, management costs increase.

SUMMARY

Provided are power management chips and power management devices including a power management chip capable of reducing noise generation, reducing manufacturing costs, and improving power efficiency.

Additional aspects will be set forth in part in the description which follows and, in part, will be apparent from the description, or may be learned by practice of example embodiments.

According to an aspect of at least one example embodiment, a power management chip includes at least one power switch and a driver unit for generating a driving signal for driving the at least one power switch, the driver unit including one or more circuit units formed on a same substrate as the at least one power switch.

According to another aspect of at least one example embodiment, a power management chip includes at least one power switch, a controller unit formed on the same substrate as the at least one power switch, the controller unit configured to generate a control signal for controlling a power management operation via the at least one power switch, and a driver unit for generating a driving signal for driving the at least one power switch in response to the control signal from the controller unit, the driver unit including one or more circuit units formed on a same substrate as the at least one power switch.

According to another aspect of at least one example embodiment, a power management device includes a module board, and a power management chip on the module board. The power management chip includes at least one power switch and a driver unit including one or more circuit units formed on a same substrate as the at least one power switch.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the widths and thicknesses of layers and regions are exaggerated for clarity.

Figure 1:
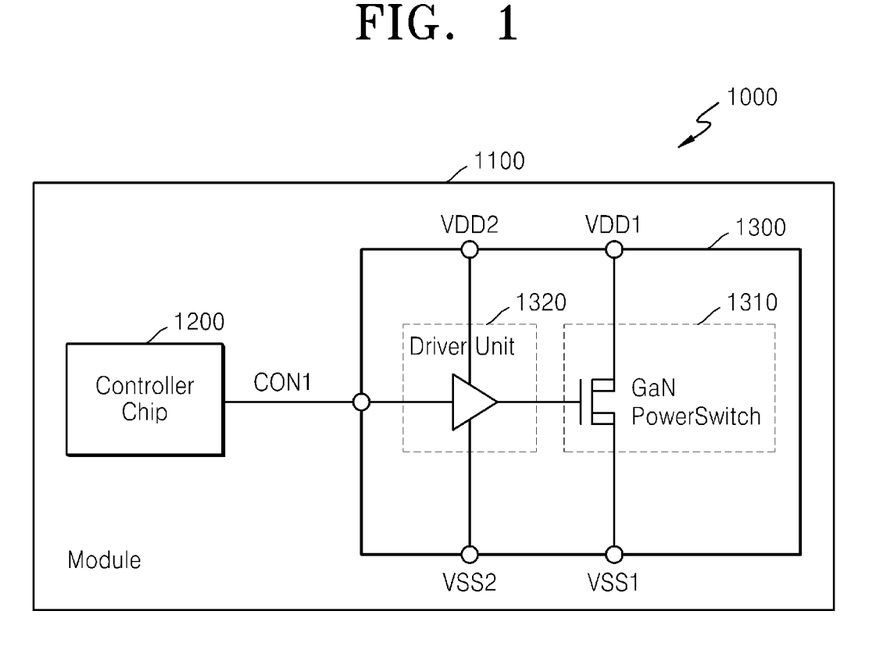
FIG. 1 is a schematic block diagram of a power management chip and a power management device including the power management chip, according to an example embodiment.

FIG. 1 is a schematic block diagram of a power management chip 1300 and a power management device 1000 including the power management chip 1300, according to an example embodiment. As shown in FIG. 1, the power management device 1000 may include a module board 1100 and the power management chip 1300 mounted on the module board 1100. In addition, a controller chip 1200 communicating outside of the power management device 1000 and generating a control signal CON1 for controlling the power management chip 1300 may be further mounted on the module board 1100 of the power management device 1000.

One or more semiconductor chips are mounted on the module board 1100, and the semiconductor chips may transmit/receive signals to/from each other via electric wires formed on the module board 1100. The controller chip 1200 communicates outside of the power management device 1000, for example, generates the control signal CON1 for controlling the power management chip 1300 in response to a command from an external host (not shown), and provides the power management chip 1300 with the control signal CON1 through the electric wires on the module board 1100. The controller chip 1200 may be realized as an additional chip separate from the power management chip 1300, and one or more controlling circuits (not shown) included in the controller chip 1200 may be fabricated through a separate process from the power management chip 1300, for example, an n-channel metal oxide semiconductor (NMOS) process and a p-channel metal oxide semiconductor (PMOS) process.

The power management chip 1300 may include a power switch 1310 and a driver unit 1320. The power switch 1310 may include one or more power semiconductors, for example, a gallium nitride (GaN) transistor or a silicon carbide (SiC) transistor based on a compound semiconductor such as GaN or SiC. Otherwise, the power switch 1310 may include an insulated gate bipolar transistor. In FIG. 1, the power switch 1310 includes the GaN transistors, and the power switch 1310 is connected between a first voltage VDD1 of a relatively high voltage and a second voltage VSS1 of a relatively low voltage. When the power switch 1310 is switched under control of the driver unit 1320, an electric power is provided to a device (not shown) located outside of the power management device 1000. The power switch 1310 is driven by a high voltage transistor and, for example, may be connected to a power voltage source of 1000 V or less to switch the voltage under the control of the driver unit 1320.

The driver unit 1320 includes one or more circuit units generating driving signals for driving the power switch 1310. The circuit units may include a circuit unit for processing the control signal CON1 to generate an internal signal, and a gate driver for driving a gate of the power switch 1310. The circuit units in the driver unit 1320 may be driven by voltages VDD2 and VSS2.

The power switch 1310 and the driver unit 1320 are realized by one semiconductor chip. For example, processes for forming the power switch 1310 and processes for forming the driver unit 1320 are performed on the same semiconductor substrate to integrate the power switch 1310 and the driver unit 1320 on the same chip. In addition, at least some of the processes for forming the power switch 1310 and at least some of the processes for forming the driver unit 1320 may be performed as the same processes.

By adding a MOS transistor process for realizing the driver unit 1320 to a MOS transistor process for realizing the power switch 1310, the power switch 1310 and the driver unit 1320 may be provided on the same semiconductor substrate (or the same wafer). As an example, to form the driver unit 1320, a gate forming process, a doping process, and a channel forming process may be added. In addition, the power management chip 1300 may be realized as one of chips of various levels, for example, the power management chip 1300 may have a wafer level scale.

Since the power switch 1310 and the driver unit 1320 are provided on the same chip, RLC values between the power switch 1310 and the driver unit 1320 may be minimized to reduce possibilities of generating noise and wrong operations. In addition, since the power switch 1310 and the driver unit 1320 are formed on the same chip, processes for forming an additional chip may be reduced, thereby reducing manufacturing costs.

Figure 2:
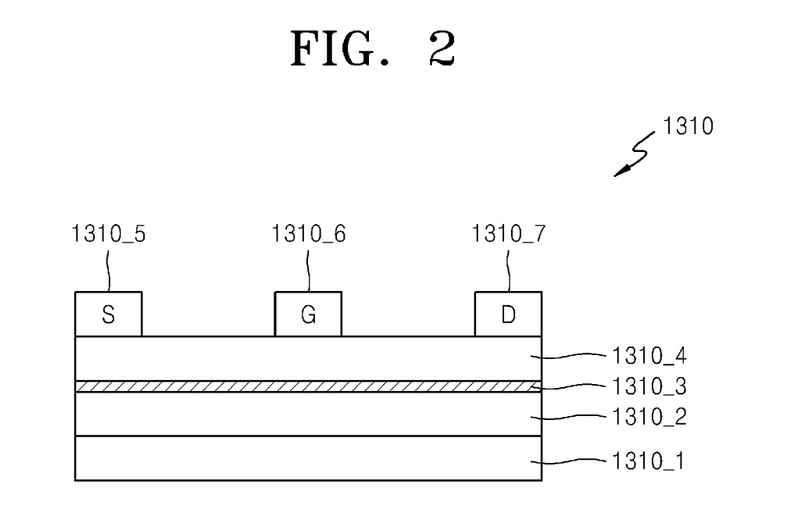
FIG. 2 is a cross-sectional view of an example of a power switch shown in FIG. 1.

FIG. 2 is a cross-sectional view showing an example of the power switch 1310 shown in FIG. 1. As shown in FIG. 2, the power switch 1310 includes a semiconductor substrate 1310_1, and a lower semiconductor layer 1310_2, a channel layer 1310_3, an upper semiconductor layer 1310_4, and one or more electrodes stacked on the semiconductor substrate 1310_1. The one or more electrodes may include a source electrode 1310_5, a gate electrode 1310_6, and a drain electrode 1310_7.

The source electrode 1310_5, the gate electrode 1310_6, and the drain electrode 1310_7 are formed on the upper semiconductor layer 1310_4 to be separated from each other, and each may include a conductive material. In addition, the lower semiconductor layer 1310_2 and the upper semiconductor layer 1310_4 may include materials having different band gaps from each other, for example, the lower semiconductor layer 1310_2 may include materials such as GaN, GaAs, and InN, and the upper semiconductor layer 1310_4 may include materials such as AlGaN, AlGaAs, and AlInN. A 2-dimensional electron gas (2DEG) layer may be induced on a bonding surface between the lower and upper semiconductor layers 1310_2 and 1310_4 according to the difference between the band gaps of the lower and upper semiconductor layers 1310_2 and 1310_4, and the 2DEG layer may function as the channel layer 1310_3.

Figure 3:
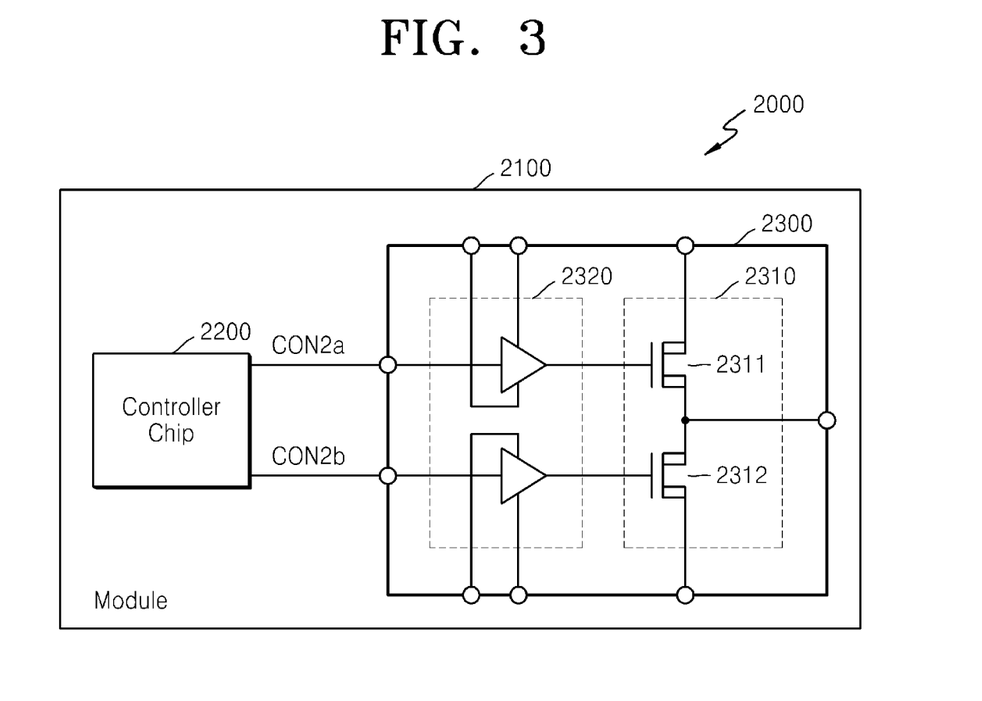
FIG. 3 is a schematic block diagram of a power management chip and a power management device including the power management chip, according to another example embodiment.

FIG. 3 is a schematic block diagram of a power management chip 2300 and a power management device 2000 including the power management chip 2300, according to another example embodiment. As shown in FIG. 3, the power management device 2000 may include a module board 2100 and the power management chip 2300 mounted on the module board 2100. In addition, a controller chip 2200 generating control signals CON2a and CON2b for controlling the power management chip 2300 may be further mounted on the module board 2100.

According to the power management device 2000 shown in FIG. 3, the power management chip 2300 may include a power switch unit 2310 and a driver unit 2320 for driving the power switch unit 2310. The power switch unit 2310 includes a first power switch 2311 for transferring a high voltage and a second power switch 2312 for transferring a low voltage, and the driver unit 2320 may include a first driver unit for driving the first power switch 2311 and a second driver unit for driving the second power switch 2312. In FIG. 3, the power switch unit 2310 includes two power switches for transferring the high voltage and the low voltage respectively; however, the power switch unit 2310 may include more power switches according to kinds of applications to which the power management device 2000 may be applied. The driver unit 2320 may include more driver units according to the number of power switches.

The driver unit 2320 receives the control signals CON2a and CON2b from the controller chip 2200, and generates a driving signal for driving the power switch unit 2310 by processing the received control signals CON2a and CON2b. In addition, the power switches of the power switch unit 2310 and one or more driver units included in the driver unit 2320 may be formed on the same semiconductor substrate and realized as one chip. Like in the embodiment shown in FIG. 1, a MOS process for forming the driver unit 2320 may be added to a MOS transistor process for forming the power switch unit 2310 so that the power switch unit 2310 and the driver unit 2320 may be provided on the same semiconductor substrate (or the same wafer).

The driver unit 2320 may further include one or more circuit units (not shown) for processing the control signals CON2a and CON2b provided from the controller chip 2200 to generate internal signals, in addition to the gate driver for driving gates of the first and second power switches 2311 and 2312. The gate driver or the circuit unit in the driver unit 2320 may be formed through the MOS process. For example, processes for forming the GaN transistor or the SiC transistor as the first and second power switches 2311 and 2312 are performed on the semiconductor substrate, and at the same time, an NMOS process and/or a depletion MOS (DMOS) process for forming the gate driver or the circuit unit is additionally performed. Then, the power switch unit 2310 and the driver unit 2320 may be integrated in the same semiconductor chip.

Figure 4:
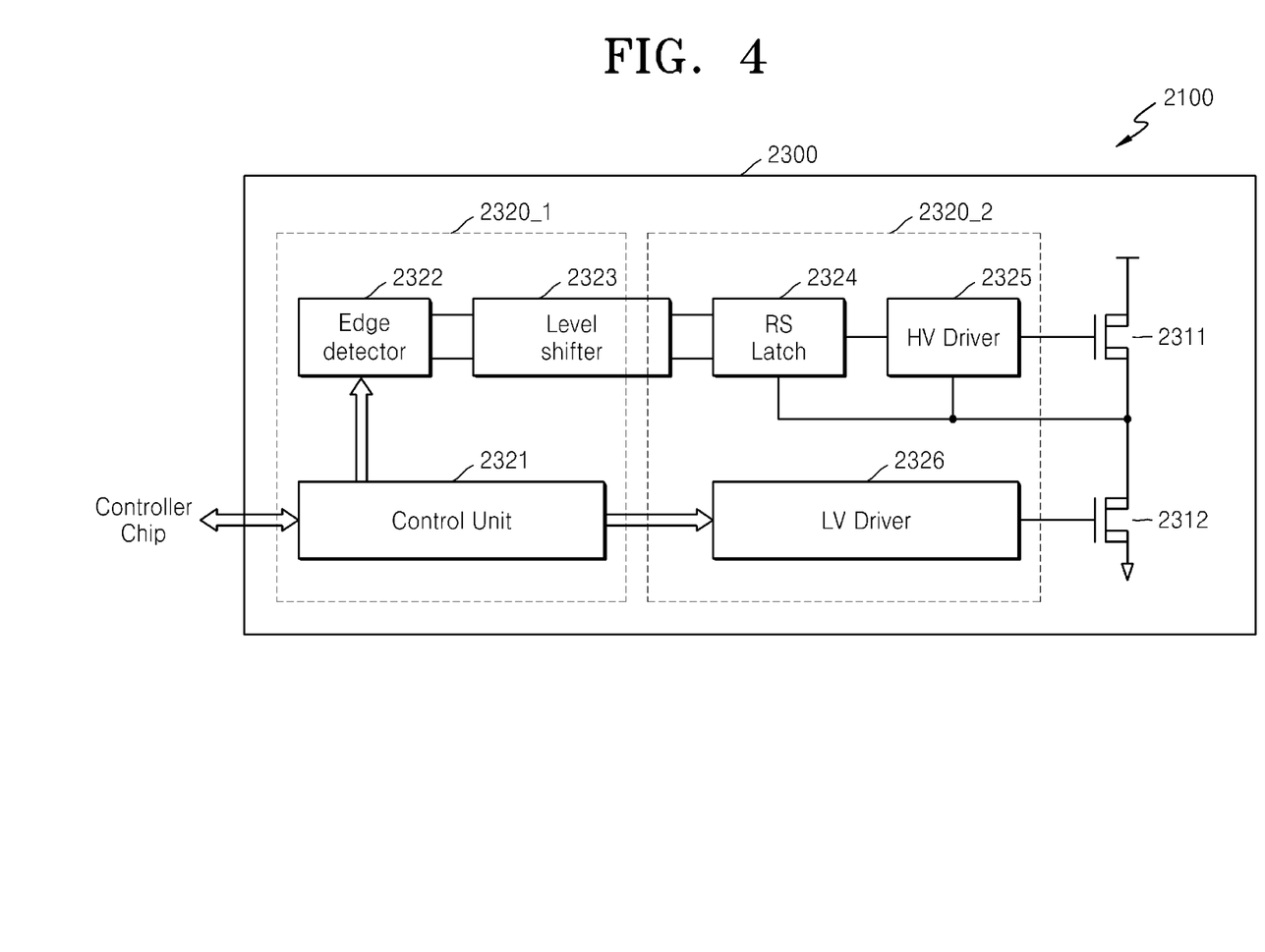
FIG. 4 is a schematic block diagram of an example of the power management chip shown in FIG. 3.

FIG. 4 is a schematic block diagram of an example of forming the power management chip 2300 shown in FIG. 3. As shown in FIG. 4, the power management chip 2300 may include the first and second power switches 2311 and 2312, and may include various circuit units for driving the first and second power switches 2311 and 2312.

The driver unit 2320 may include a first circuit unit 2320_1 and a second circuit unit 2320_2. For example, the first circuit unit 2320_1 may be driven based on a relatively low voltage (for example, 0 to 3 V), and the second circuit unit 2320_2 may be driven based on a relatively high voltage (for example, 3 to 30 V). In FIG. 4, the first circuit unit 2320_1 includes a control unit 2321, an edge detector 2322, and at least a part of a level shifter 2323, and the second circuit unit 2320_2 includes at least a different part of the level shifter 2323, a latch 2324, a first gate driver 2325 for driving the gate of the first power switch 2311, and a second gate driver 2326 for driving the gate of the second power switch 2312.

The control unit 2321 communicates with an external controller chip, and receives and processes a control signal from the external controller chip to generate a first internal control signal. The edge detector 2322 detects an edge of the internal control signal to generate an edge detection signal for adjusting switching timings of the first and second power switches 2311 and 2312, and provides the level shifter 2323 with the edge detection signal. The level shifter 2323 shifts a level of the edge detection signal according to an operating voltage characteristic of the second circuit unit 2320_2, and generates an edge detection signal whose level is shifted (a second internal control signal).

On the other hand, the latch 2324 generates an output signal in response to the second internal control signal from the level shifter 2323, and provides the first gate driver 2325 with the output signal. The latch 2324 may be formed as an RS latch having setting/resetting functions, and generates and latches an output signal by using the second internal control signal as a set signal or a reset signal. The latched output signal is provided to the first gate driver 2325, and the first gate driver 2325 generates a first driving signal for driving the gate of the first power switch 2311 in response to the output signal.

Meanwhile, the control unit 2321 may further generate an internal control signal for controlling the second gate driver 2326 in response to the control signal from the external controller chip. The second gate driver 2326 generates a second driving signal for driving the gate of the second power switch 2312 in response to the internal control signal of the control unit 2321.

Various circuit units included in the driver unit 2320 may be formed by additionally performing the NMOS process and/or DMOS process on the same substrate as the semiconductor substrate on which the first and second power switches 2311 and 2312 are formed. In addition, since the high voltage transistor using the GaN or the SiC may be used to transfer data, the high voltage transistor formed in the same process as those of the first and second power switches 2311 and 2312 may be applied to at least a part of the various circuit units. For example, load units may be connected to output ends of the latch 2324 or the first and second gate drivers 2325 and 2326, and in the circuit forming the load unit, the high voltage transistor formed in the same process as those of the first and second power switches 2311 and 2312 may be applied instead of the PMOS.

Figure 5:
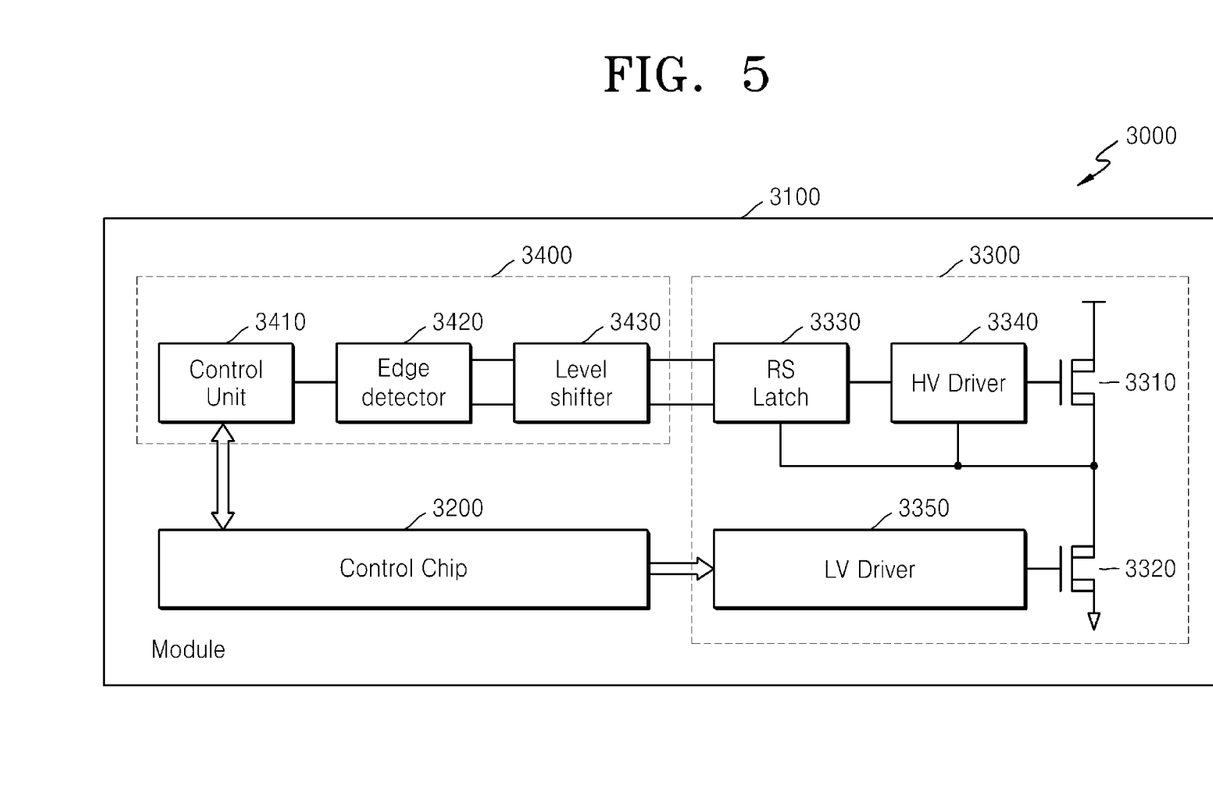
FIG. 5 is a schematic block diagram of a power management chip and a power management device including the power management chip, according to another example embodiment.

FIG. 5 is a schematic block diagram of a power management chip 3300 and a power management device 3000 including the power management chip 3300, according to another example embodiment. As shown in FIG. 5, the power management device 3000 may include a module board 3100 and the power management chip 3300 mounted on the module board 3100. In addition, a controller chip 3200 generating a control signal for controlling the power management chip 3300 and a driving chip 3400 processing the control signal from the controller chip 3200 to generate an internal control signal may be further mounted on the module board 3100.

The power management chip 3300 may include one or more power switches (first and second power switches 3310 and 3320) formed of GaN or SiC transistors, and may further include one or more gate drivers 3340 and 3350 for driving gates of the power switches 3310 and 3320 and a latch 3330 for latching the control signal provided from outside. The driving chip 3400 is a semiconductor chip including other circuit units that are used for driving the power switches 3310 and 3320. The driving chip 3400 may be realized as a separate chip from the power management chip 3300, and may include a control unit 3410, an edge detector 3420, and a level shifter 3430. Various circuits included in the power management chip 3300 and various circuits included in the driving chip 3400 are the same as or similar to those of the above described embodiments, and detailed descriptions will not be provided here.

According to FIG. 5, some of the various circuits of the driver unit for driving the power switches 3310 and 3320 are on the same chips as the power switches 3310 and 3320. In forming the various circuits of the driver unit, the circuits are formed to be on the same chips as the power switches 3310 and 3320 in consideration of whether the NMOS, DMOS, and/or PMOS are used. For example, on the semiconductor substrate on which processes for forming the GaN or SiC transistor are performed, when an NMOS transistor can be formed by performing an additional MOS transistor process, the gate drivers 3340 and 3350 may be formed on the same chip as the power switches 3310 and 3320. Otherwise, when the NMOS and DMOS transistors can be formed on the semiconductor substrate, the circuit units driving in a high voltage range may be formed on the same chip as the power switches 3310 and 3320. As shown in FIG. 5, the latch 3330 may be formed on the same chip as the power switches 3310 and 3320, or a part of the level shifter (a circuit region for processing an output signal whose level is shifted) 3430 may be formed on the same chip as the power switches 3310 and 3320, as shown in FIG. 5.

In FIG. 5, the gate drivers 3340 and 3350 and the latch 3330 are formed on the same chip as the power switches 3310 and 3320; however, example embodiments are not limited thereto. For example, when the NMOS and PMOS transistors can be formed through the MOS processes on the semiconductor substrate on which the power switches 3310 and 3320 are formed, at least a part of the various circuits included in the driving chip 3400 may be formed on the same chip as the power switches 3310 and 3320.

Figure 6:
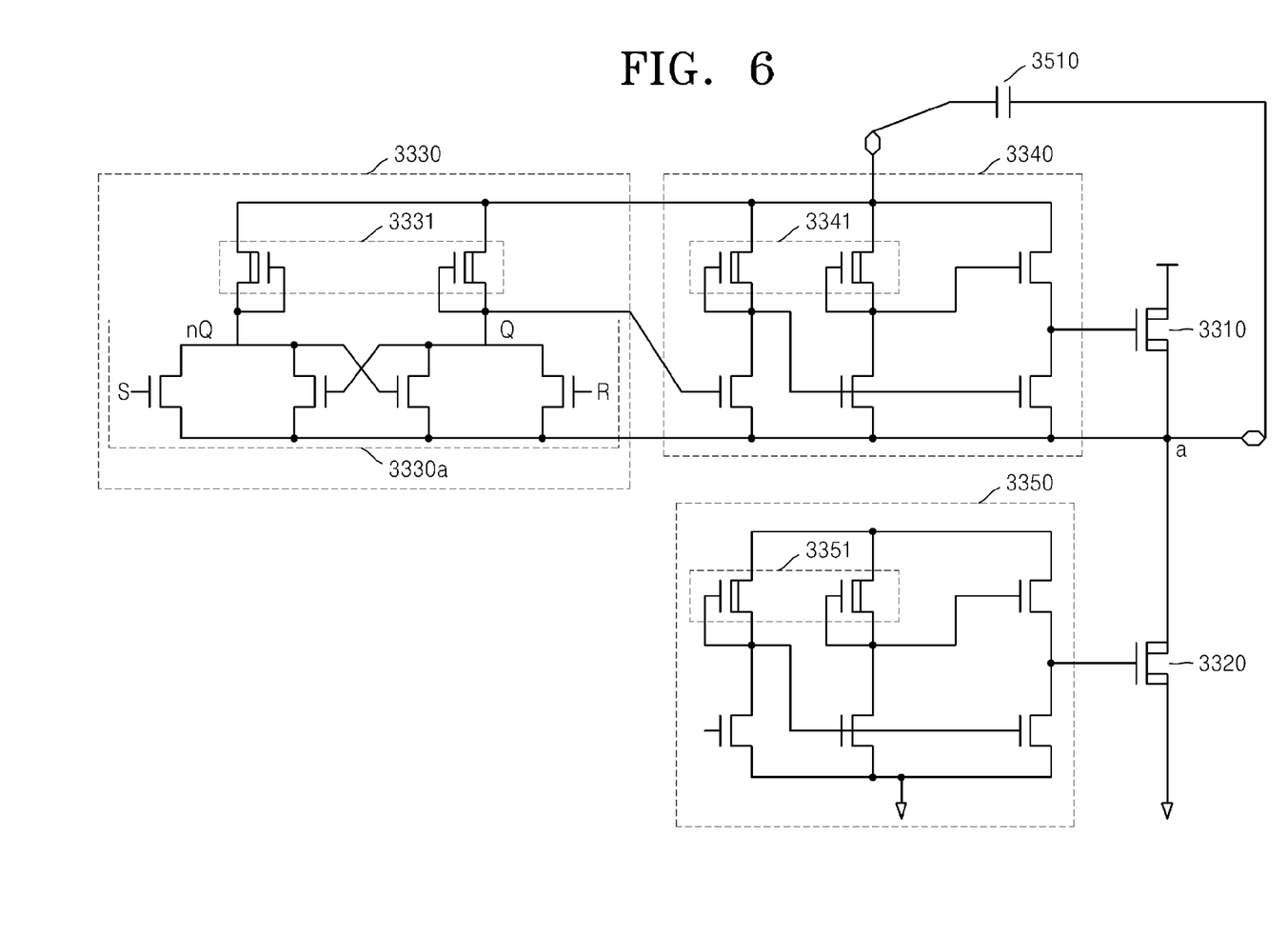
FIG. 6 is a circuit diagram showing an example of the power management chip shown in FIG. 5.

FIG. 6 is a circuit diagram of an example of forming the power management chip 3300 of FIG. 5. As shown in FIG. 6, the power management chip 3300 may include the first and second power switches 3310 and 3320, and the latch 3330 and the first and second gate drivers 3340 and 3350 as circuit units for driving the first and second power switches 3310 and 3320. The latch 3330 and the first and second gate drivers 3340 and 3350 may be formed on the same chip as the first and second power switches 3310 and 3320. In addition, the power management chip 3300 may further include a capacitor 3510 connected between an output end (a) of the first power switch 3310 and a power voltage source that applies a power voltage to the first gate driver 3340. When a voltage at the output end (a) increases, a level of the voltage applied to the first gate driver 3340 may increase due to a coupling effect of the capacitor 3510.

The latch 3330 may include an RS latch circuit 3330a to which a set signal S and a reset signal R are input, and a load unit 3331 connected to output ends Q and nQ of the RS latch circuit. The RS latch circuit may include NMOS transistors receiving the set signal S and the reset signal R via gates, respectively, and NMOS transistors having gates respectively connected to the output ends Q and nQ. On the other hand, the load unit 3331 may include one or more transistors respectively connected to the output ends Q and nQ, and the transistors of the load unit 3331 may be DMOS transistors each having a gate connected to a source terminal.

Meanwhile, the first gate driver 3340 may include one or more inverters formed by using DMOS transistors as a load, and as shown in FIG. 6, the transistors of a load unit 3341 may be connected to output ends of the inverter. The transistors included in the load unit 3341 of the first gate driver 3340 may be DMOS transistors, each having a gate connected to a source terminal. In addition, the second gate driver 3350 may include one or more inverters formed by using DMOS transistors as a load. A load unit 3351 in the second gate driver 3350 may include DMOS transistors, each having a gate connected to a source terminal.

As shown in FIG. 6, the various circuits of the driver unit, which are formed on the same chip as the first and second power switches 3310 and 3320, are formed by the NMOS transistor and the DMOS transistor processes, and may be formed by additionally performing the NMOS and the DMOS transistor processes on the semiconductor substrate on which the first and second power switches 3310 and 3320 are formed.

Figure 7:
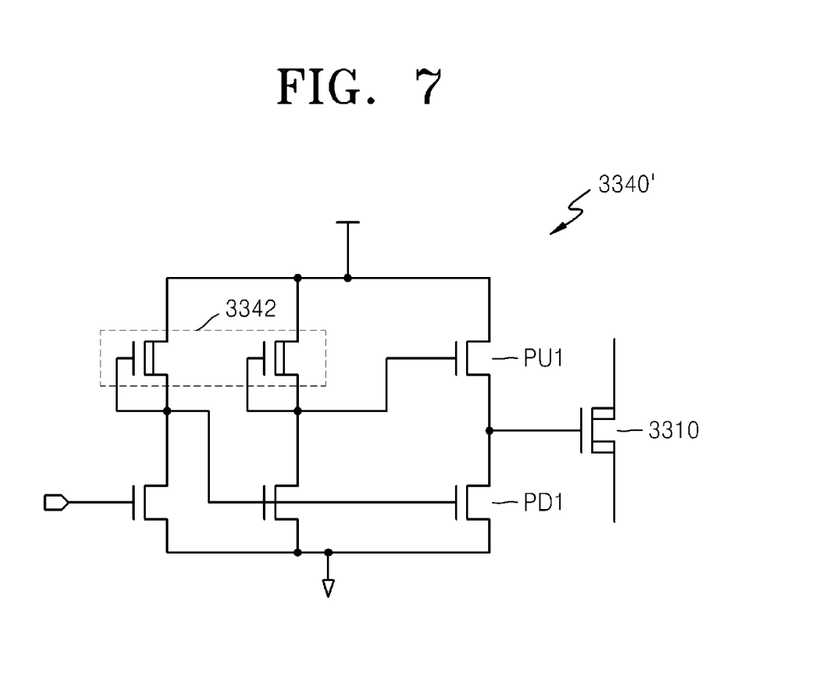
FIG. 7 is a circuit diagram showing another example of a gate driver in the power management chip of FIG. 5.

FIG. 7 is a circuit diagram showing another example of forming the gate driver of the power management chip 3300 of FIG. 5. FIG. 7 only shows a first gate driver 3340' for convenience of description, and the first power switch 3310 receiving the driving signal from the first gate driver 3340' is also shown. However, it should be understood that a second gate driver may include the same circuit.

The first gate driver 3340' may include one or more inverters, and a load unit 3342 may be formed in the first gate driver 3340 by using high voltage transistors (for example, a GaN transistor or a SiC transistor) formed in the same processes as the first power switch 3310. The load unit 3342, formed by using the high voltage transistors, may be applied to an inverter that is used to transfer an internal control signal for driving the first gate driver 3340', and a pullup transistor PU1 and a pulldown transistor PD1 of the inverter that are directly connected to the gate of the first power switch 3310 may be formed as the NMOS transistors.

According to the example shown in FIG. 7, when applying the load unit 3342 to one or more inverters, a separate process from the NMOS transistor process (for example, the PMOS transistor process) is not necessary, and the first gate driver 3340' is formed on the same chip as the first power switch 3310. Therefore, the load unit 3342 may be formed together when the first power switch 3310 is formed.

Figure 8:
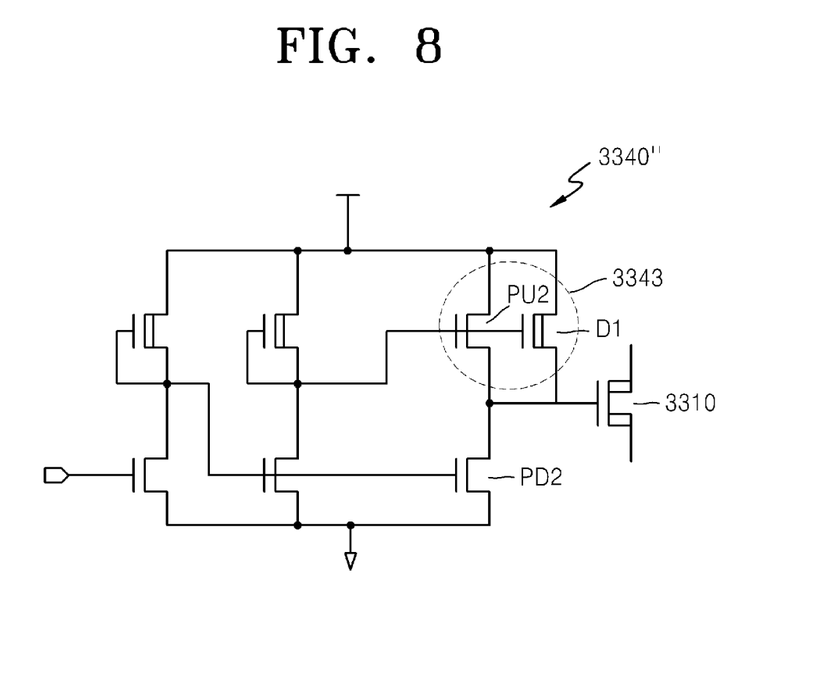
FIG. 8 is a circuit diagram showing another example of a gate driver in the power management chip of FIG. 5.

FIG. 8 is a circuit diagram of another example of forming the gate driver in the power management chip 3300 shown in FIG. 5. FIG. 8 shows only a first gate driver 3340" for convenience of description, and the first power switch 3310 receiving the control signal from the first gate driver 3340" is also shown. However, it should be understood that a second gate driver may include the same circuit.

The first gate driver 3340" may include inverters of a plurality of stages, and each of the inverters may include a pullup transistor PU2 and a pulldown transistor PD2. In an inverter of a last stage for providing the gate of the first power switch 3310 with the driving signal, when the pullup transistor PU2 is formed as the NMOS transistor, a voltage drop of the output voltage may occur and the high voltage may not be transferred to the gate of the first power switch 3310. For example, the voltage output from the pullup transistor PU2 may be reduced by a threshold voltage of the corresponding transistor, and as the voltage at the source terminal increases, electric current is reduced.

According to FIG. 8, a MOS transistor D1 that is connected in parallel to the pullup transistor PU2 of the inverter of the last stage is further disposed so that the pullup transistor PU2 and the MOS transistor D1 connected to the pullup transistor PU2 in parallel may form a pullup unit 3343. The MOS transistor D1 that is connected to the pullup transistor PU2 in parallel may be a DMOS transistor, and the DMOS transistor D1 may reduce the voltage drop and compensate for the electric current. Since the DMOS transistor D1 is formed on the same semiconductor chip as the first power switch 3310, the DMOS transistor D1 may be formed by additionally performing the DMOS transistor process on the same semiconductor substrate, and may be formed through the same process as that of the DMOS transistor that forms the load unit provided at another inverter terminal.

Meanwhile, in order to minimize a leakage current flowing through the DMOS transistor when the first gate driver 3340" is turned off, a width of the NMOS transistor of the pullup unit 3343 is increased so as to function as a main driver and a width of the DMOS transistor is reduced to function as an auxiliary driver. That is, a driving function of the DMOS transistor is minimized so as to perform compensation of the voltage and the current.

Figure 9:
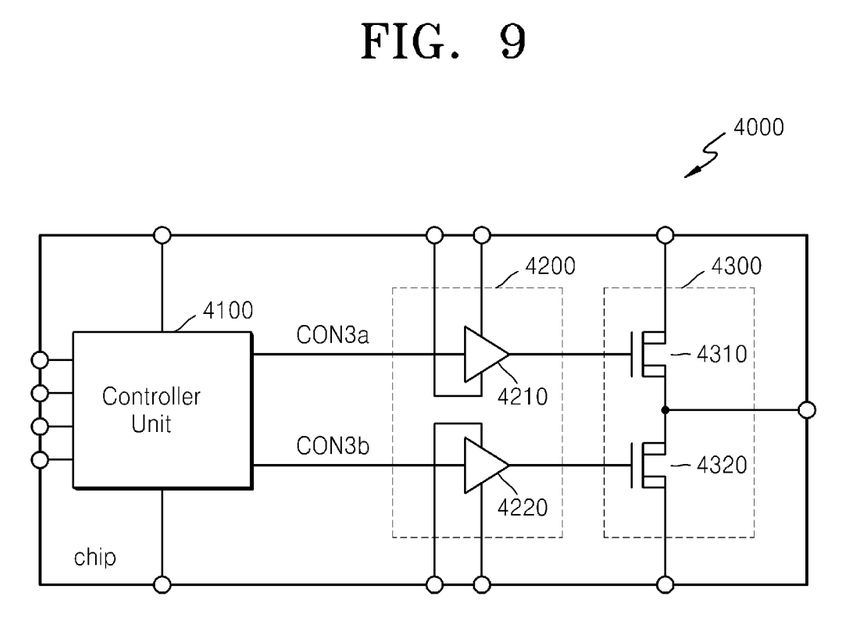
FIG. 9 is a schematic block diagram of an example of a power management chip, according to another example embodiment.

FIG. 9 is a schematic block diagram of a power management chip 4000 according to another example embodiment. In FIG. 9, at least some of circuits of a controller relating to control of a power switch and at least some of circuits of a driver unit for driving a gate of the power switch are formed on the same chip as the power switch. In FIG. 9, all of the circuits in the controller and the driver unit are formed on the same chip as the power switch.

As shown in FIG. 9, the power management chip 4000 includes a controller 4100, a driver unit 4200, and a power switch unit 4300. The power switch unit 4300 may include one or more power switches, that is, a first power switch 4310 and a second power switch 4320. The driver unit 4200 may include a first driver unit 4210 for driving a gate of the first power switch 4310 and a second driver unit 4220 for driving a gate of the second power switch 4320.

The controller unit 4100 performs operations that are the same as or similar to those of the controller chip described in the previous example embodiments. For example, the controller unit 4100 may communicate outside of the power management chip 4000, generate control signals CON3*a* and CON3*b* for controlling the power switch unit 4300, and provide the driver unit 4200 with the generated control signals CON3*a* and CON3*b*. The driver unit 4200 receives the control signals CON3*a* and CON3*b* and processes the control signals to generate driving signals for driving a gate of the power management chip 4000. As described in the previous example embodiments, the driver unit 4200 may include various circuit units for performing edge detection, level shifting, latching, and inverting operations.

According to FIG. 9, the controller unit 4100, the driver unit 4200, and the power switch unit 4300 are integrated on the same chip. Circuits included in the controller unit 4100 or the driver unit 4200 may be formed by using at least one of the NMOS transistor process, the DMOS transistor process, and the PMOS transistor process, and the circuits that are to be integrated on the same chip as the power switch unit 4300 may be determined according to the kind of MOS transistor process that may be performed on the semiconductor substrate on which the GaN or SiC transistor is formed. When the circuit units of the driver unit 4200 are formed by using the NMOS and/or the DMOS transistor process and the circuit units of the controller unit 4100 further require the PMOS transistor process, the driver unit 4200 may be formed on the same chip as the power switch unit 4300 in a case where the NMOS and the DMOS transistor processes may be performed on the semiconductor substrate. On the other hand, when the PMOS transistor process may be performed on the semiconductor substrate, both the controller unit 4100 and the driver unit 4200 may be formed on the same chip as the power switch unit 4300.

Figure 10:
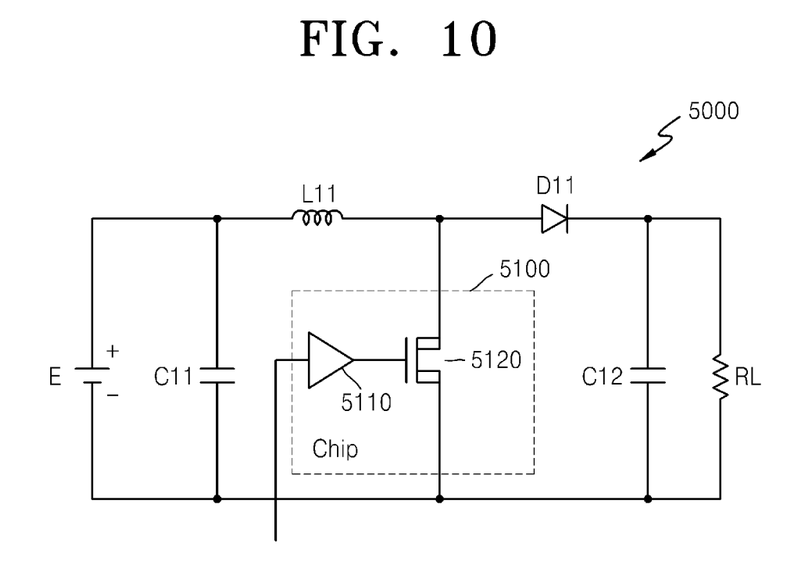
FIG. 10 is a circuit diagram of an example of a power management device adopting the power management chip, according to an example embodiment.

FIG. 10 is a circuit diagram showing an example of forming a power management device 5000 adopting a power management chip 5100, according to an example embodiment. As shown in FIG. 10, the power management device 5000 includes the power management chip 5100, and the power management chip 5100 includes a driver unit 5110 and a power switch 5120 formed in the same semiconductor chip. The driver unit 5110 receives a control signal from a controller chip (not shown) disposed on an outer portion of the power management chip 5100 to drive the power switch 5120 as previously described, or receives a control signal from a controller unit disposed in the power management chip 5100 to drive the power switch 5120.

In addition, various circuits relating to the power management operations of the power management chip 5100 may be further included in the power management device 5000, for example, a power supply unit E, a first capacitor C11 for removing a noise component of a power voltage or planarizing a voltage level, and a second capacitor C12 for accumulating electric charges while the power management switch 5120 of the power management chip 5100 is turned on to provide a load unit RL with an output voltage having a converted voltage level (for example, a boosted voltage level) may be further included in the power management device 5000. Moreover, an inductor L11 connected between an electrode of the first capacitor C11 and an electrode of the power switch 5120 and a diode D11 connected between an electrode of the second capacitor C12 and an electrode of the power switch 5120 may be further included in the power management device 5000.

Although not shown in FIG. 10, the power management device 5000 may further include a module board on which the power management chip 5100 is mounted, and the above described various devices, for example, the power supply unit E, the first and second capacitors C11 and C12, the inductor L11, and the diode D11 may be mounted on the module board, in addition to the power management chip 5100. Also, FIG. 10 shows an example where the various devices are mounted on the module board on an outer portion of the power management chip 5100; however, example embodiments are not limited thereto. For example, at least one of the various devices may be formed in the power management chip 5100. In integrating the above devices on the power management chip 5100, the device that may be formed by the MOS process that is allowed on the semiconductor substrate on which the power management chip 5100 is formed may be integrated on the power management chip 5100, as described above.

Figure 11:
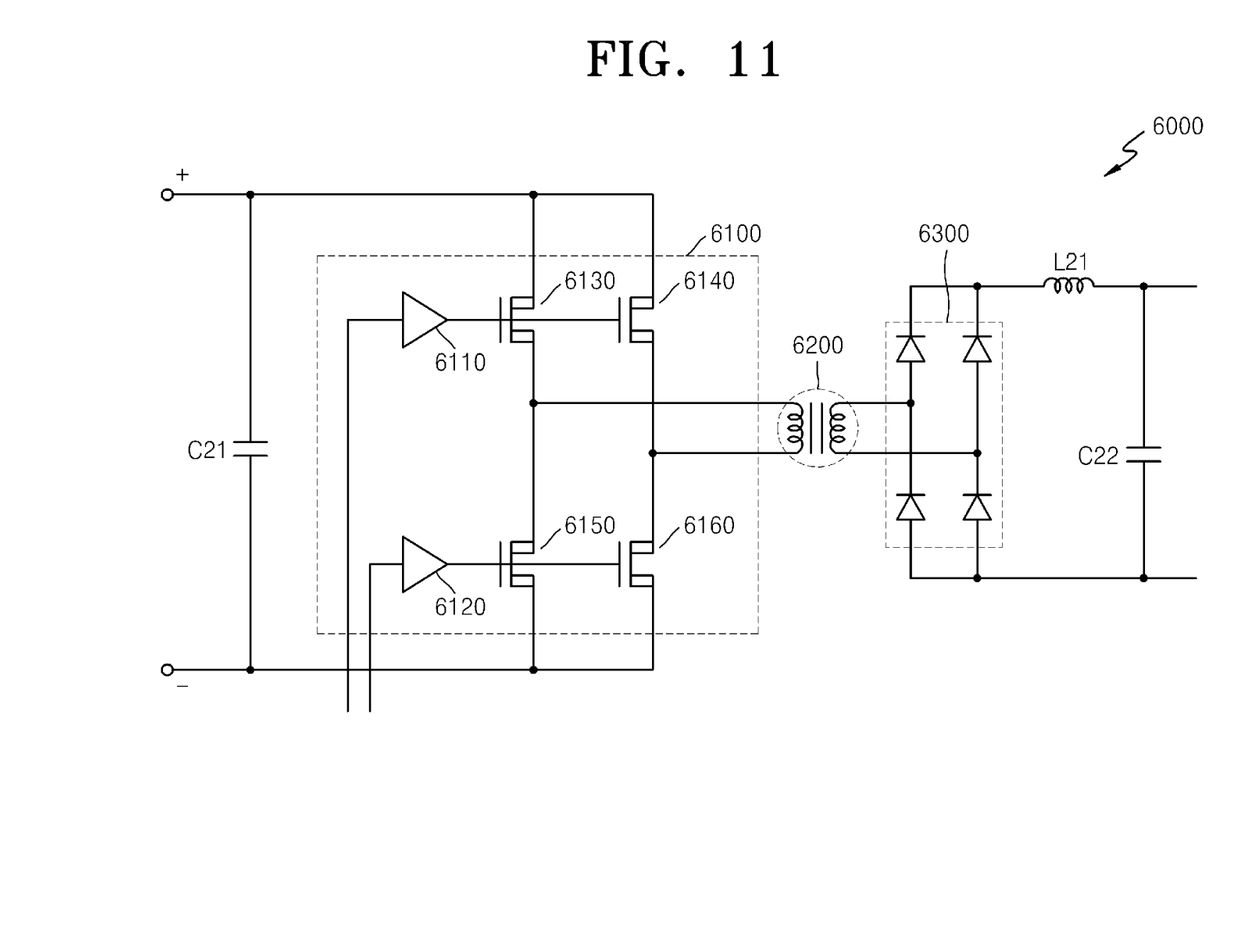
FIG. 11 is a circuit diagram of another example of a power management device adopting the power management chip, according to an example embodiment.

FIG. 11 is a circuit diagram showing another example of forming a power management device 6000 adopting a power management chip 6100, according to another example embodiment. As shown in FIG. 11, the power management device 6000 includes a power management chip 6100, and the power management chip 6100 may include one or more driver units 6110 and 6120 and one or more power switches 6130, 6140, 6150, and 6160 formed on a same semiconductor chip. The driver units 6110 and 6120 receive control signals from a controller chip located on an outer portion of the power management chip 6100, or a controller unit on the power management chip 6100 to drive the power switches 6130, 6140, 6150, and 6160.

In addition, the power management device 6000 may further include various circuits relating to the power management operations of the power management chip 6100, for example, a rectifying unit including a first capacitor C21 for removing a noise component in a power voltage or planarizing a voltage level, a rectifier including one or more diodes 6300, an inductor L21, and a second capacitor C22, and a transformer unit 6200 for converting a level of output voltages from the power switches 6130, 6140, 6150, and 6160. The power switches 6130, 6140, 6150, and 6160 switch and output the voltage in response to the driving signals from the driver units 6110 and 6120, and the output voltages are used as an electric power of another device after transforming and rectifying processes.

Although not shown in FIG. 11, the power management device 6000 may further include a module board on which the power management chip 6100 is mounted, and the above described devices may be mounted on the module board. In addition, according to the MOS processes that are allowed on the semiconductor substrate on which the power management chip 6100 is formed, at least some of the various devices disposed outside of the power management chip 6100 in FIG. 11 may be formed as the same semiconductor chip as the power management chip 6100.

According to the power management chip and the power management device including the power management chip of example embodiments, the power switch and the driver for driving the power switch are integrated on one semiconductor chip, and thus generation of noise due to the RLC components may be reduced and power efficiency may be improved. Moreover, for the cost of manufacturing the power management chip and the power management device may be reduced.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A power management device comprising:
    a module board;
    a power management chip on the module board; and
    a driving chip on the module board,
    wherein the power management chip includes,
    at least one power switch, a gate of the power switch is configured to receive a driving signal generated by a first circuit and a second circuit, the first circuit including at least one PMOS transistor and configured to operate in a first voltage region, the second circuit not including any PMOS transistors and configured to operate in a second voltage region, and only NMOS and DMOS processes are performed on the substrate in addition to a transistor process for forming the power switch, the first voltage region being a lower voltage region than the second voltage region, and
    a driver including the second circuit on a same substrate as the at least one power switch by adding the NMOS and DMOS processes to the transistor process for forming the power switch, the driver is configured to generate the driving signal using a control signal from the driving chip,
    wherein the driving chip includes the first circuit, the first circuit configured to generate the control signal.

2. The power management device of claim 1, wherein the at least one power switch may be formed as one of a gallium nitride (GaN) transistor, a silicon carbide (SiC) transistor, and an insulated gate bipolar transistor.

3. The power management chip device of claim 1, wherein the power management chip has a wafer level chip scale.

4. The power management device of claim 1, wherein the at least one power switch comprises:
    a first power switch configured to output a high voltage, and a second power switch for outputting a low voltage, and the second circuit includes a first gate driver for driving a gate of the first power switch and a second gate driver for driving a gate of the second power switch.

5. The power management device of claim 1, wherein the second circuit comprises:
    a latch configured to generate an output signal in response to the control signal for controlling the at least one power switch; and
    a gate driver configured to receive the output signal from the latch, and for generating the driving signal in response to the output signal to provide the gate of the at least one power switch with the driving signal.

6. The power management device of claim 5, wherein the first circuit comprises:
    a control unit configured to generate an internal control signal in response to an external control signal;
    an edge detector configured to detect an edge of the internal control signal to generate an edge detection signal; and
    a level shifter configured to generate the first control signal by shifting a level of the edge detection signal.

7. The power management device of claim 5, wherein the latch comprises:

a latch circuit configured to generate a latch output signal in response to the control signal; and a load unit configured to connect to an output terminal of the latch circuit, and comprising at least one depletion transistor.

8. The power management device of claim 5, wherein the gate driver comprises inverters, and at least one of the inverters includes a depletion transistor connected between a power voltage source and an output terminal of the gate driver.

9. The power management device of claim 8, wherein an inverter of a last stage of the inverters is connected to the gate of the at least one power switch and includes a pullup transistor and a pulldown transistor, the pullup and pulldown transistors being n-channel metal oxide semiconductor (NMOS) transistors.

10. The power management device of claim 9, wherein the inverter of the last stage of the inverters further includes a depletion transistor connected to the pullup transistor in parallel.

11. The power management device of claim 1, wherein the second circuit comprises:

a pullup transistor configured to pull up a level of the driving signal provided to the gate of the at least one power switch;

a pulldown transistor configured to pull down the level of the driving signal provided to the gate of the at least one power switch; and a depletion transistor connecting to the pullup transistor in parallel, and having a lower driving power than the pullup transistor.

12. The power management device of claim 1, wherein each of transistors included in the second circuit is one selected between an NMOS transistor and a depletion MOS (DMOS) transistor.

13. The power management device of claim 1, wherein the second circuit comprises at least one driver and a latch,
wherein the latch includes at least one latch circuit formed by performing the NMOS process and a load unit formed by performing the DMOS process, and
wherein each driver includes at least one inverter formed by performing the NMOS process and a load unit formed by the DMOS process or the transistor process for forming the power switch.

* * * * *